US012580164B2

(12) United States Patent
McKee et al.

(10) Patent No.: US 12,580,164 B2
(45) Date of Patent: Mar. 17, 2026

(54) SEMICONDUCTOR PROCESSING TOOL CLEANING

(71) Applicant: TEXAS INSTRUMENTS INCORPORATED, Dallas, TX (US)

(72) Inventors: Gregory McKee, Riverton, UT (US); David Claar, Draper, UT (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 369 days.

(21) Appl. No.: 18/072,021

(22) Filed: Nov. 30, 2022

(65) Prior Publication Data

US 2024/0177977 A1 May 30, 2024

(51) Int. Cl.
*H01J 37/32* (2006.01)
*H01L 21/02* (2006.01)

(52) U.S. Cl.
CPC .. *H01J 37/32862* (2013.01); *H01J 37/32449* (2013.01); *H01L 21/02057* (2013.01); *H01J 37/32091* (2013.01); *H01J 2237/334* (2013.01)

(58) Field of Classification Search
CPC ........... H01J 37/32862; H01J 37/32449; H01J 37/32091; H01J 2237/334; H01L 21/02057
See application file for complete search history.

(56) References Cited

U.S. PATENT DOCUMENTS 6,374,833 B1 * 4/2002 Yuan ................. H01J 37/32844
134/1.1
7,662,235 B2 * 2/2010 Yoshida ................. B08B 7/0035
134/1

9,533,332 B2 * 1/2017 Sun ...................... C23C 16/4405
2001/0000141 A1 * 4/2001 Zhou ...................... C01B 35/061
423/241
2002/0179569 A1 * 12/2002 Outka ....................... C23F 4/00
257/E21.311
2003/0008517 A1 * 1/2003 Ko .................... H01L 21/32139
257/E21.314
2003/0013314 A1 * 1/2003 Ying ................ H01L 21/32136
257/E21.311
2003/0129847 A1 * 7/2003 Celii ...................... H10D 1/694
257/E21.664

(Continued)

FOREIGN PATENT DOCUMENTS

JP 3566522 B2 * 9/2004

OTHER PUBLICATIONS

JP-3566522-B2, Machine Translation. (Year: 2025).*

*Primary Examiner* — Duy Vu N Deo
*Assistant Examiner* — Christopher Remavege
(74) *Attorney, Agent, or Firm* — Andrew R. Ralston; Frank D. Cimino

(57) ABSTRACT

The present disclosure generally relates to semiconductor processing tool cleaning, such as may be included in semiconductor processing for manufacturing an integrated circuit (IC). In an example, a cleaning process is performed on an interior surface of a chamber of a semiconductor processing tool. The cleaning process includes flowing a reactive gas into an interior volume of the chamber. The interior volume is defined at least in part by the interior surface. The reactive gas consists exclusively of boron trichloride ($BCl_3$). After performing the cleaning process, a material layer over a semiconductor substrate is etched in the chamber.

18 Claims, 6 Drawing Sheets

406

502 — PERFORM A CLEANING PROCESS COMPRISING FLOWING A REACTIVE GAS CONSISTING OF BORON TRICHLORIDE ($BCL_3$) INTO THE INTERIOR VOLUME OF THE CHAMBER

504 — PERFORM A PURGE OF THE INTERIOR VOLUME OF THE CHAMBER COMPRISING FLOWING A NON-REACTIVE GAS INTO THE INTERIOR VOLUME OF THE CHAMBER

506 — PERFORM A CLEANING PROCESS COMPRISING FLOWING AN OXYGEN-CONTAINING GAS INTO THE INTERIOR VOLUME OF THE CHAMBER

508 — PERFORM A PURGE OF THE INTERIOR VOLUME OF THE CHAMBER COMPRISING FLOWING A GAS INTO THE INTERIOR VOLUME OF THE CHAMBER

(56)  References Cited

U.S. PATENT DOCUMENTS

| | | | | |
|---|---|---|---|---|
| 2003/0143853 A1* | 7/2003 | Celii | H10D 1/682 | 257/E21.664 |
| 2004/0103914 A1* | 6/2004 | Cheng | H01J 37/32862 | 134/1.1 |
| 2004/0217087 A1* | 11/2004 | Celii | H10D 1/682 | 257/E21.314 |
| 2004/0222188 A1* | 11/2004 | Kim | B08B 7/0035 | 216/67 |
| 2005/0003088 A1* | 1/2005 | Park | C23C 16/4405 | 134/1.1 |
| 2005/0130427 A1* | 6/2005 | Won | C23C 16/4405 | 438/689 |
| 2005/0136662 A1* | 6/2005 | Tsai | H01L 24/05 | 257/E21.252 |
| 2006/0191555 A1* | 8/2006 | Yoshida | B08B 7/0035 | 134/1.1 |
| 2008/0096332 A1* | 4/2008 | Lee | H10D 86/60 | 438/151 |
| 2009/0163037 A1* | 6/2009 | Miya | C23C 16/4404 | 257/E21.24 |
| 2009/0194801 A1* | 8/2009 | Celii | H10D 1/696 | 257/295 |
| 2012/0094499 A1* | 4/2012 | Ng | B08B 7/0035 | 257/E21.218 |
| 2013/0087174 A1* | 4/2013 | Sun | H01J 37/32449 | 134/30 |
| 2014/0083453 A1* | 3/2014 | Yin | C23C 16/4405 | 134/1.1 |
| 2015/0243489 A1* | 8/2015 | Uda | H01J 37/32862 | 134/1.1 |
| 2018/0347037 A1* | 12/2018 | Zhai | H01J 37/32862 | |
| 2020/0294777 A1* | 9/2020 | Hirota | H01L 22/26 | |

* cited by examiner

400

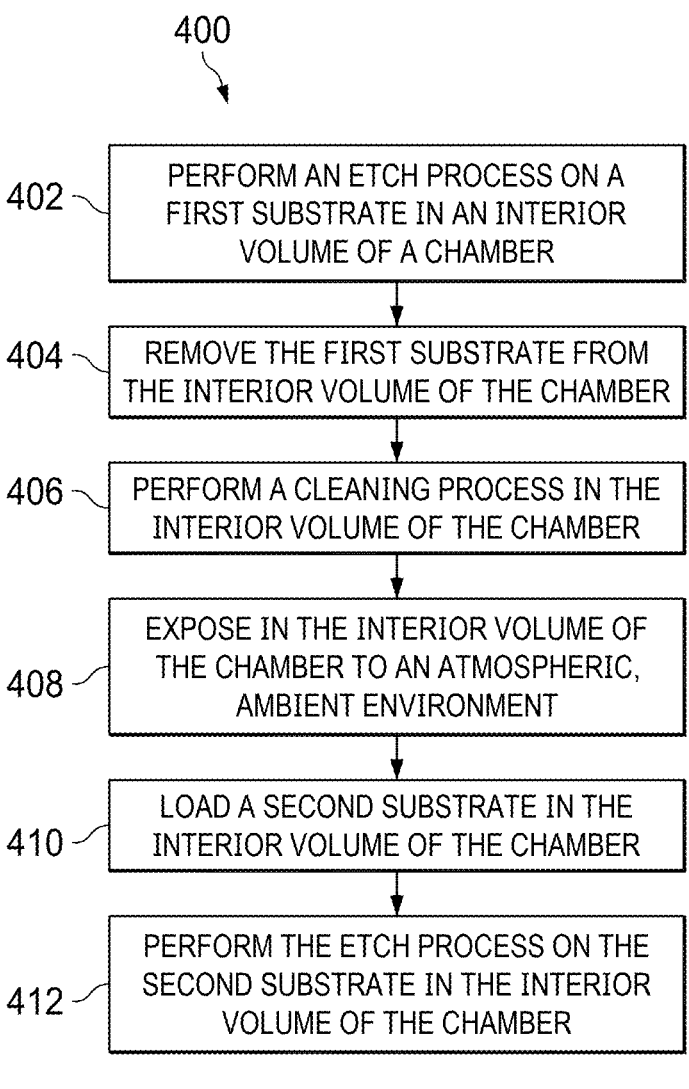

402 — PERFORM AN ETCH PROCESS ON A FIRST SUBSTRATE IN AN INTERIOR VOLUME OF A CHAMBER

404 — REMOVE THE FIRST SUBSTRATE FROM THE INTERIOR VOLUME OF THE CHAMBER

406 — PERFORM A CLEANING PROCESS IN THE INTERIOR VOLUME OF THE CHAMBER

408 — EXPOSE IN THE INTERIOR VOLUME OF THE CHAMBER TO AN ATMOSPHERIC, AMBIENT ENVIRONMENT

410 — LOAD A SECOND SUBSTRATE IN THE INTERIOR VOLUME OF THE CHAMBER

412 — PERFORM THE ETCH PROCESS ON THE SECOND SUBSTRATE IN THE INTERIOR VOLUME OF THE CHAMBER

FIG. 4

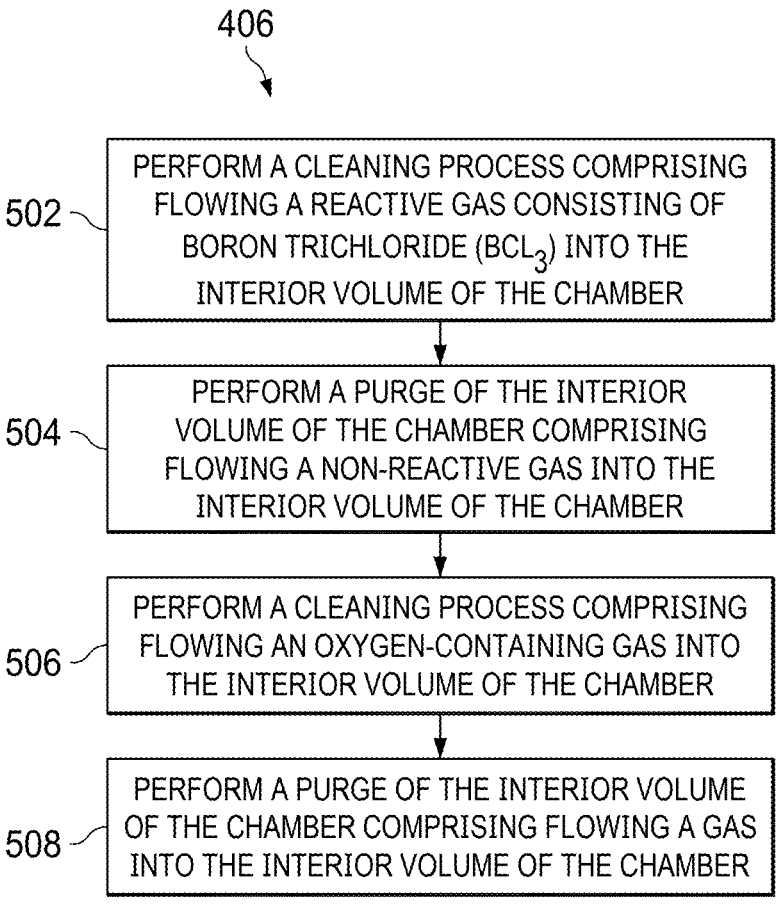

406

502 — PERFORM A CLEANING PROCESS COMPRISING FLOWING A REACTIVE GAS CONSISTING OF BORON TRICHLORIDE (BCL$_3$) INTO THE INTERIOR VOLUME OF THE CHAMBER

504 — PERFORM A PURGE OF THE INTERIOR VOLUME OF THE CHAMBER COMPRISING FLOWING A NON-REACTIVE GAS INTO THE INTERIOR VOLUME OF THE CHAMBER

506 — PERFORM A CLEANING PROCESS COMPRISING FLOWING AN OXYGEN-CONTAINING GAS INTO THE INTERIOR VOLUME OF THE CHAMBER

508 — PERFORM A PURGE OF THE INTERIOR VOLUME OF THE CHAMBER COMPRISING FLOWING A GAS INTO THE INTERIOR VOLUME OF THE CHAMBER

SEMICONDUCTOR PROCESSING TOOL CLEANING

BACKGROUND

Integrated circuit (IC) dies are typically manufactured using precise semiconductor processing. A small error in that semiconductor processing, such as a misalignment, may significantly adversely affect yield. Further, even a small contamination of an IC die during semiconductor processing may render that IC die inoperable. Due to this, IC fabrication facilities may implement protocols and procedures to reduce possible contamination. One familiar protocol is the implementation of clean rooms at these fabrication facilities. However, even with such protocols in place, contamination and other errors in semiconductor processing may occur.

SUMMARY

This summary is provided to introduce a brief selection of disclosed concepts in a simplified form that are further described below in the detailed description including the drawings provided. Various disclosed devices and methods may be beneficially applied in the context of semiconductor processing in which an aluminum-based byproduct may be produced in the formation of an integrated circuit (IC) die. Some examples described herein may be applied to a cleaning process for a semiconductor processing tool. While such examples may be expected to decrease contamination and particles in a semiconductor processing tool, no particular result is a requirement unless explicitly recited in a particular claim.

An example described herein is a method of manufacturing an integrated circuit (IC). A cleaning process is performed on an interior surface of a chamber of a semiconductor processing tool. The cleaning process includes flowing a reactive gas into an interior volume of the chamber. The interior volume is defined at least in part by the interior surface. The reactive gas consists exclusively of boron trichloride ($BCl_3$). After performing the cleaning process, a material layer over a semiconductor substrate is etched in the chamber.

Another example described herein is a method. A reactive gas consisting of boron trichloride ($BCl_3$) is flowed into an interior volume of a chamber of a semiconductor processing tool. After flowing the reactive gas, a first purge of the interior volume of the chamber is performed, which includes flowing a non-reactive gas into the interior volume of the chamber. After performing the first purge, an oxygen-containing gas is flowed into the interior volume of the chamber. After flowing the oxygen-containing gas, a second purge of the interior volume of the chamber is performed, which includes flowing a gas into the interior volume of the chamber.

A further example described herein is a processing tool for semiconductor processing. The processing tool includes a chamber, a substrate support, and a controller. The chamber has an interior volume. The substrate support is disposed in the interior volume, and the substrate support includes a support surface configured to support a semiconductor substrate. The controller includes one or more processors and non-transitory memory that includes stored instructions. The instructions, when executed by the one or more processors, cause the controller to: flow a reactive gas consisting of boron trichloride ($BCl_3$) into the interior volume of the chamber; after flowing the reactive gas, perform a first purge of the interior volume of the chamber including flowing a non-reactive gas into the interior volume of the chamber; after performing the first purge, flow an oxygen-containing gas into the interior volume of the chamber; and after flowing the oxygen-containing gas, perform a second purge of the interior volume of the chamber including flowing a gas into the interior volume of the chamber.

An even further example described herein is a method of cleaning a semiconductor etching tool. A cleaning process is performed on an interior surface of a chamber of the semiconductor etching tool. The cleaning process includes flowing one reactive gas into an interior volume of the chamber. The interior volume is defined at least in part by the interior surface. The one reactive gas consisting of boron trichloride ($BCl_3$).

The foregoing summary outlines rather broadly various features of examples of the present disclosure in order that the following detailed description may be better understood. Additional features and advantages of such examples will be described hereinafter. The described examples may be readily utilized as a basis for modifying or designing other examples that are within the scope of the appended claims.

BRIEF DESCRIPTION OF THE DRAWINGS

So that the manner in which the above recited features may be understood in detail, reference is made to the following detailed description taken in conjunction with the accompanying drawings.

FIG. 4 is a flowchart of a method of manufacturing IC dies according to some examples.

FIG. 5 is a flowchart of a method of cleaning a semiconductor processing tool according to some examples.

Figure 1:
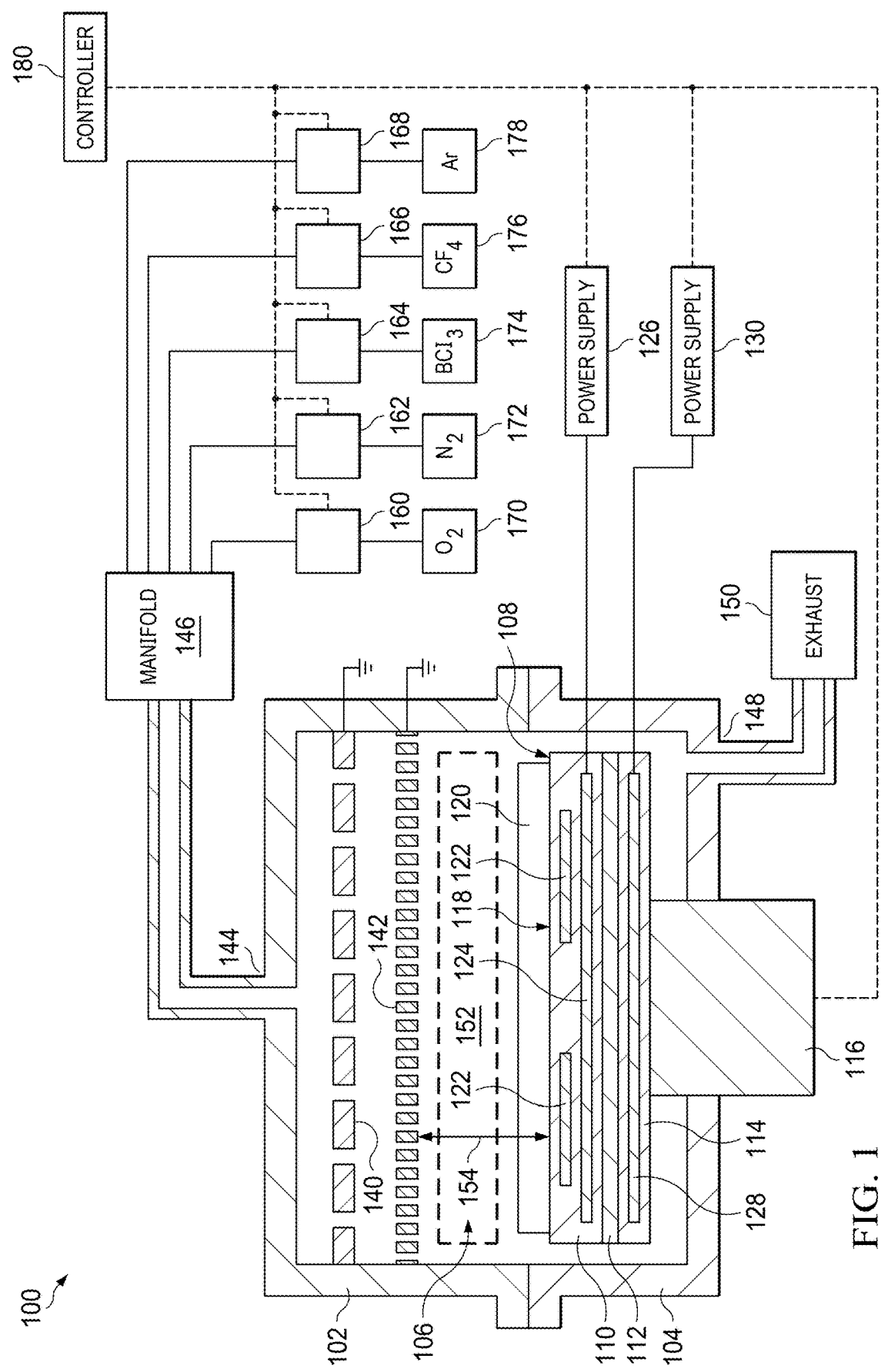
FIG. 1 is a schematic view of a semiconductor processing tool for semiconductor processing according to some examples.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An illustrated example may not have all the aspects or advantages shown. An aspect or an advantage described in conjunction with a particular example is not necessarily limited to that example and may be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

The present disclosure relates to semiconductor processing tool cleaning, such as may be included in semiconductor processing for manufacturing an integrated circuit (IC). Example methods of cleaning are described, as well as example semiconductor processing tools configured to perform such cleaning. According to some examples, a cleaning process for cleaning an interior volume of a chamber of a semiconductor processing tool includes flowing a reactive gas into the interior volume, where the reactive gas consists of boron trichloride ($BCl_3$). In such examples, no other reactive gas is flowed with the boron trichloride ($BCl_3$), and particularly, chlorine gas ($Cl_2$) is not flowed with the boron trichloride ($BCl_3$) in the cleaning process. Other operations of the cleaning process may include flowing another reactive gas(es). The cleaning process may volatize and remove aluminum-based byproducts (e.g., aluminum fluoride) that may be deposited on or adhered to surfaces in the interior volume of the chamber. In some implementations, the aluminum-based byproducts may become deposited on or adhered to the surfaces during, for example, an etch process that exposes an aluminum feature or any other process that may produce an aluminum-based byproduct. The cleaning process may therefore remove aluminum-based byproducts that might otherwise flake from the surfaces and cause particles to contaminate a product substrate (e.g., wafer on which an IC die is fabricated) and/or to land on an electrostatic chuck (ESC) in the chamber. This cleaning may be performed without the use of some other reactive gases, particularly, chlorine gas ($Cl_2$) which in some cases may not be plumbed to the tool. Further, decreased down time of the semiconductor processing tool and increased yield of product IC dies may be achieved. Other benefits or advantages may be achieved by various examples.

FIG. 1 is a schematic view of a semiconductor processing tool 100 for semiconductor processing according to some examples. The semiconductor processing tool 100 in FIG. 1 is illustrated simplistically so as to not obscure various aspects described herein. The semiconductor processing tool 100 is shown as a capacitively coupled plasma (CCP) processing tool in this example. In other examples, the semiconductor processing tool 100 may be configured as an inductively coupled plasma (ICP) processing tool, electron cyclotron resonance (ECR) processing tool, or another processing tool. The semiconductor processing tool 100, in some examples, is a semiconductor etching tool. In some examples, the semiconductor processing tool 100 may be a tool for other semiconductor processing.

The semiconductor processing tool 100 includes a chamber including an upper chamber housing 102 and a lower chamber housing 104. The upper chamber housing 102 engages or mates with the lower chamber housing 104 to form the chamber, which has an interior volume 106. The interior volume 106 is defined by inner walls of the chamber (e.g., the upper chamber housing 102 and lower chamber housing 104).

The semiconductor processing tool 100 includes a substrate support 108 disposed in the interior volume 106 of the chamber. The substrate support 108 includes an electrostatic chuck (ESC) 110, a heater 112, and a baseplate 114. In the illustrated configuration, the heater 112 is disposed over and on the baseplate 114, and the ESC 110 is disposed over and on the heater 112. The substrate support 108 is disposed on and is supported by a pedestal 116. The baseplate 114 is disposed over and on the pedestal 116. The substrate support 108 has a support surface 118 that is configured to support a semiconductor substrate 120 during a semiconductor process. During a semiconductor process, a semiconductor substrate 120 is disposed on the support surface 118 of the substrate support 108.

The ESC 110 includes chucking electrodes 122 and a processing electrode 124 disposed in and/or coated by a dielectric material. The chucking electrodes 122 are electrically coupled to a power supply (e.g., a direct current (DC) power supply (not illustrated)) and are configured to chuck the semiconductor substrate 120 to the substrate support 108, such as by electrostatic force. The processing electrode 124 is electrically coupled to a power supply 126 and is configured as a capacitive plate for generating a plasma. The power supply 126 is electrically coupled to the processing electrode 124 to supply power to the processing electrode 124 for generating a plasma. The power supply 126 may be configured to generate and supply an alternating current (AC) power to the processing electrode 124, such as at a radio frequency (e.g., a frequency of 13.56 MHz or 60 MHz) or another frequency. The power supply 126 may supply AC power with any voltage or ampere signal waveform, such as a triangle waveform, square waveform, sine waveform, pulse waveform, or the like. The power supply 126 may include other components that are not illustrated, such as an impedance matching network.

The heater 112 may include one or more resistive heating elements disposed in a dielectric, heat-conducting material. An electrical current can flow through the one or more resistive heating elements, which can generate thermal energy that is conducted to the semiconductor substrate 120.

The baseplate 114 includes a bias electrode 128 disposed in and/or coated by a dielectric material. The bias electrode 128 is electrically coupled to a power supply 130. The power supply 130 is electrically coupled to the bias electrode 128 to supply power to the bias electrode 128 for a bias power, which may improve drivability of the processing electrode 124. The power supply 130 may be configured to generate and supply an AC power to the bias electrode 128, such as at a radio frequency (e.g., a frequency of 13.56 MHz or 60 MHz) or another frequency. The power supply 130 may supply AC power with any voltage or ampere signal waveform, such as a triangle waveform, square waveform, sine waveform, pulse waveform, or the like. The power supply 130 may include other components that are not illustrated, such as an impedance matching network and/or frequency matching circuitry. In some examples, the baseplate 114 may include fluid channels disposed in and/or coated by the dielectric material. The fluid channels may be configured to have a fluid (e.g., a liquid or gas) flowing therethrough to remove and dissipate thermal energy from the semiconductor substrate 120. The fluid channels may be referred to as a cooler.

The semiconductor processing tool 100 further includes a gas distribution plate 140 and a gas showerhead 142 disposed in the interior volume 106 of the chamber (e.g., in the upper chamber housing 102). The gas distribution plate 140 has openings therethrough, and the gas showerhead 142 has openings therethrough. The gas distribution plate 140 and the gas showerhead 142 are electrically coupled to a ground node (e.g., are electrically grounded). The gas showerhead 142 is configured as a capacitive plate for generating a plasma (e.g., with the processing electrode 124). The chamber (e.g., the upper chamber housing 102) has a gas inlet 144 fluidly coupled to a gas manifold 146, and the chamber (e.g., the lower chamber housing 104) has a gas outlet 148 fluidly coupled to an exhaust system 150. The gas distribution plate 140 and gas showerhead 142 are positioned in the interior volume 106 of the chamber relative to the substrate support 108 such that, during a semiconductor process, a gas flows from the gas manifold 146, through the gas inlet 144, through the openings through the gas distribution plate 140, and then through the openings through the gas showerhead 142 to a processing volume 152 in the interior volume 106. The processing volume 152 is disposed between the gas showerhead 142 and the substrate support 108 and is generally where a plasma is generated (using the gas flowed into the processing volume 152) during a semiconductor process. A semiconductor substrate 120 disposed on the support surface 118 of the substrate support 108 is exposed to plasma in the processing volume 152 during the semiconductor process. The gas can then flow through the gas outlet 148 to the exhaust system 150 to be exhausted out of the interior volume 106 of the chamber.

A gap 154 is from the support surface 118 to the gas showerhead 142 in a direction normal to the support surface 118. The gap 154 may at least in part define the processing volume 152. The pedestal 116 may be configured to raise and lower the substrate support 108 such that the gap 154, and the processing volume 152, may be varied.

The gas manifold 146 is fluidly coupled separately to mass flow controllers 160, 162, 164, 166, 168, and the mass flow controllers 160, 162, 164, 166, 168 are fluidly coupled to gas canisters 170, 172, 174, 176, 178, respectively. The mass flow controllers 160-168 are configured to selectively open and close. When in an opened position the mass flow controllers 160-168 allow gas from the respective gas canister 170-178 to flow through the respective mass flow controller 160-168 to the gas manifold 146. When in a closed position the mass flow controllers 160-168 prevent gas from the respective gas canister 170-178 from flowing therethrough. The gas manifold 146 may pass a gas flowing from a mass flow controller 160-168 to the chamber and/or may mix and pass gases flowing from multiple mass flow controllers 160-168 to the chamber. As illustrated, in some examples, the gas canister 170 contains oxygen ($O_2$) gas; the gas canister 172 contains nitrogen ($N_2$) gas; the gas canister 174 contains boron trichloride ($BCl_3$) gas; the gas canister 176 contains carbon tetrafluoride ($CF_4$) gas; and the gas canister 178 contains argon (Ar) gas. In some examples, the gas canisters 170-178 may contain a highly pressurized liquid form that vaporizes into gaseous form upon pressure being reduced.

Although not shown, the semiconductor processing tool 100 may include a door or slit through which a semiconductor substrate 120 is transferred between semiconductor processes. A semiconductor substrate 120 may be transferred through the door or slit (e.g., by a robot arm) and onto the support surface 118 to load the semiconductor substrate 120 prior to semiconductor processing of that semiconductor substrate 120. Similarly, the semiconductor substrate 120 may be transferred from the support surface 118 and through the door or slit (e.g., by a robot arm) to remove the semiconductor substrate 120 after semiconductor processing of the semiconductor substrate 120. A load lock or transfer chamber may engage the semiconductor processing tool 100 at the door or slit such that the interior volume 106 of the chamber of the semiconductor processing tool 100 may be maintained at low or reduced pressure (e.g., maintained at vacuum) during transfer of the semiconductor substrate 120.

The semiconductor processing tool 100 includes a controller 180. The controller 180 may be or include any processor-based system, which may be or include a hardened processor architecture, a soft processor (e.g., implemented on programmable fabric of a field programmable gate array (FPGA)), or a combination thereof. For example, the controller 180 may be or include a computer, a server, a programmable logic controller (PLC), the like, or a combination thereof. The controller 180 may control operation of the semiconductor processing tool 100 and may be programmed to implement operations of the semiconductor processing tool 100 as described herein. Among other things, the controller 180 is communicatively coupled to the pedestal 116, the power supplies 126, 130 and mass flow controllers 160-168 for controlling the operation of those components.

Figure 2:
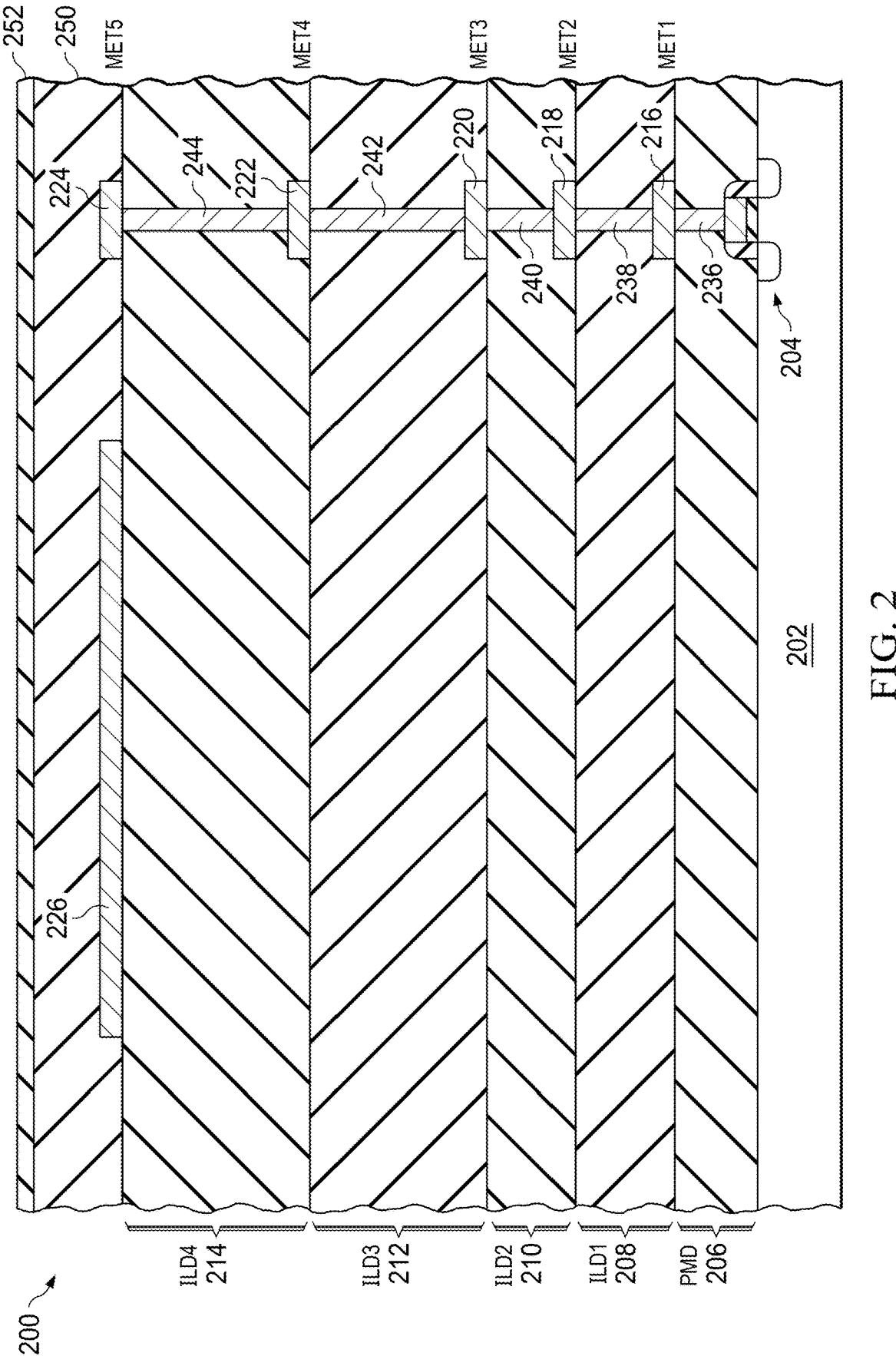
FIG. 2 is a cross-section of a portion of an integrated circuit (IC) die during fabrication according to some examples.

FIG. 2 is a cross-section of a portion of an IC die 200 during fabrication according to some examples. The IC die 200 is shown in FIG. 2 before an etch process described herein as an example. The IC die 200 includes a semiconductor substrate 202. The semiconductor substrate 202 may be any semiconductor material and may include a bulk material (e.g., bulk silicon) and/or one or more epitaxial layers of a semiconductor material. One or more semiconductor devices (e.g., transistor 204) are formed in, on, and/or over the semiconductor substrate 202.

The IC die 200 includes a pre-metal dielectric (PMD) 206 over the semiconductor substrate 202. The PMD 206 may include a conformal dielectric layer (e.g., an etch stop layer) over (e.g., possibly, on) the semiconductor substrate 202 and devices (e.g., transistor 204) and may include a dielectric layer over the conformal dielectric layer. In some examples, the conformal dielectric layer may be or include silicon nitride, silicon oxynitride, the like, or a combination thereof, and the dielectric layer may be or include phosphosilicate glass (PSG), the like, or a combination thereof.

The IC die 200 further includes a first interlayer dielectric (ILD1) 208, a second ILD (ILD2) 210, a third ILD (ILD3) 212, and a fourth ILD (ILD4) 214. The ILD1 208 is over the PMD 206. The ILD2 210 is over the ILD1 208, and the ILD3 212 is over the ILD2 210. The ILD4 214 is over the ILD3 212. Each of the ILD1 208, ILD2 210, ILD3 212, and ILD4 214 may include one or more dielectric sub-layers. In some examples, sub-layers of the ILD1 208, ILD2 210, ILD3 212, and ILD4 214 may be or include a high density plasma (HDP) silicon oxide ($SiO_x$) a tetraethyl orthosilicate (TEOS) silicon oxide, or the like.

The IC die 200 includes a first metal level (MET1), a second metal level (MET2), a third metal level (MET3), a fourth metal level (MET4), and a fifth metal level (MET5). The MET1 includes a metal line 216 disposed over (e.g., possibly, on) or in other examples, in, the PMD 206. The MET2 includes a metal line 218 disposed over (e.g., possibly, on) or in other examples, in, the ILD1 208. The MET3 includes a metal line 220 disposed over (e.g., possibly, on) or in other examples, in, the ILD2 210. The MET4 includes a metal line 222 disposed over (e.g., possibly, on) or in other examples, in, the ILD3 212. The MET5 includes a metal line 224 and a bond pad 226 disposed over (e.g., possibly, on) or in other examples, in, the ILD4 214.

The IC die 200 includes a metal contact 236 and metal vias 238, 240, 242, 244 that electrically connect various components or metal lines. Metal contact 236 extends through the PMD 206 and contacts the transistor 204 (e.g., gate of the transistor 204) and the metal line 216. Metal via 238 extends through the ILD1 208 and contacts the metal lines 216, 218. Metal via 240 extends through the ILD2 210 and contacts the metal lines 218, 220. Metal via 242 extends through the ILD3 212 and contacts the metal lines 220, 222. Metal via 244 extends through the ILD4 214 and contacts the metal lines 222, 224.

The metal contact 236, metal vias 238, 240, 242, 244, metal lines 216, 218, 220, 222, 224, and bond pad 226 each is or includes a metal. For example, each may be or include aluminum (Al), copper (Cu), tungsten (W), a combination thereof, or the like. Further, each may include a barrier and/or adhesion layer, such as titanium (Ti), titanium nitride (TiN), tantalum nitride (TaN), the like, or a combination thereof. The metal contact, metal vias, metal lines, and bond pad illustrated in FIG. 2 are shown as an example and may be configured in any arrangement, including more or fewer metal contacts, metal vias, metal lines, and/or bond pads.

The IC die 200 includes an over-layer dielectric 250 disposed over the MET5 (e.g., the metal line 224 and bond pad 226) and the ILD4 214. The over-layer dielectric 250 may include one or more dielectric sub-layers. In some examples, sub-layers of the over-layer dielectric 250 may be or include a HDP silicon oxide, a TEOS silicon oxide, or the like.

The IC die 200 includes a passivation dielectric layer 252 over the over-layer dielectric 250. In some examples, the passivation dielectric layer 252 is or includes a nitrogen-containing dielectric layer, such as silicon oxynitride, silicon nitride, or the like.

Figure 3:
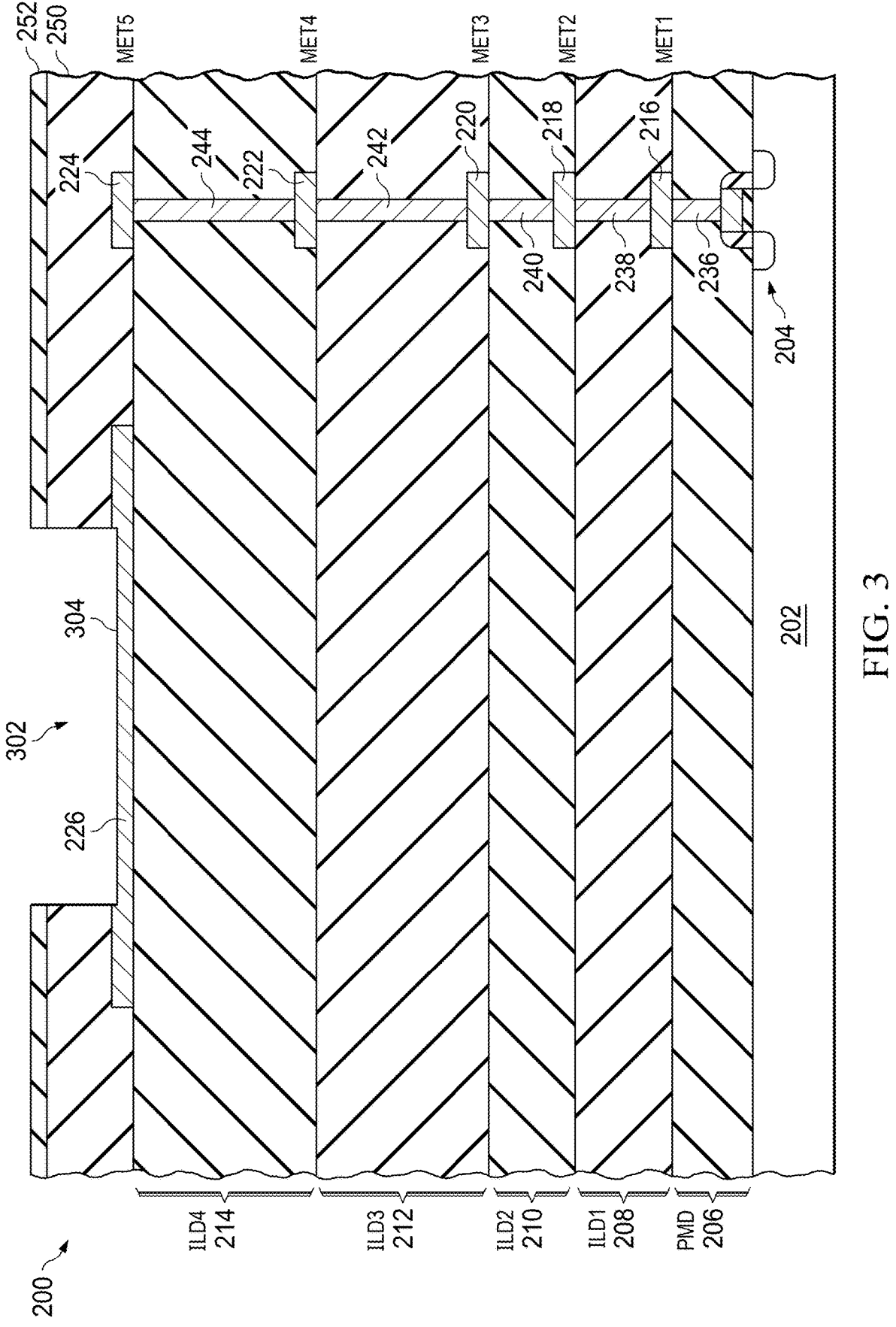
FIG. 3 is a cross-section of the portion of the IC die of FIG. 2 after an etch process according to some examples.

FIG. 3 is a cross-section of the portion of the IC die 200 after an etch process according to some examples. The passivation dielectric layer 252 and the over-layer dielectric 250 has an opening 302 therethrough that exposes the bond pad 226. The opening 302 is formed using an etch process. The etch process may also slightly etch the bond pad 226 such that a recessed surface 304 of the bond pad 226 is exposed through the opening 302. Although not illustrated, a wire may be subsequently bonded to the recessed surface 304 of the bond pad 226 for an external electrical connection to the IC die 200.

In some examples, the semiconductor processing tool 100 is used to implement an etch process on the IC die 200 to etch through the over-layer dielectric 250 to expose the bond pad 226. In such examples, the bond pad 226 may be or include aluminum or an alloy of aluminum. The etch process may slightly etch the bond pad 226, as shown by the recessed surface 304 of the bond pad 226 in FIG. 3. The slight etching of the bond pad 226 may result in aluminum-based byproducts of the etch process being deposited on or adhered to surfaces of the interior volume 106 of the chamber (e.g., the upper and lower chamber housings 102, 104). If left uncleaned, the aluminum-based byproducts may accumulate and subsequently flake off of those surfaces, particularly, once the interior volume 106 is exposed to an atmospheric, ambient environment (e.g., such as during maintenance of the semiconductor processing tool 100) that allows for a reaction between the aluminum-based byproducts and a species from the environment. In some instances, the aluminum-based byproducts may flake off of the surfaces and become deposited on an ESC or on a semiconductor substrate during subsequent semiconductor processing of that semiconductor substrate. Particles of the aluminum-based byproducts that fall on an ESC may prevent proper chucking of a semiconductor substrate by the ESC. Particles of the aluminum-based byproducts that fall on a semiconductor substrate may contaminate that substrate and reduce yield of IC dies formed on that substrate.

Although described in the context of the etch process illustrated in and described with respect to FIGS. 2 and 3, such effects may occur for any etch process that exposes or etches through an aluminum-containing feature or for any process that produces aluminum-based byproducts. For example, these effects may occur when exposing any aluminum containing metal line when etching through an ILD for forming a metal via.

To reduce these effects, in some examples, a cleaning process that removes aluminum-based byproducts may be performed in the chamber of the semiconductor processing tool 100 after an etch process and before the interior volume 106 is exposed to an atmospheric, ambient environment. The cleaning process, in a step, includes flowing one reactive gas that consists of boron trichloride ($BCl_3$). The reactive gas ($BCl_3$), in that step, may be flowed with a non-reactive gas (e.g., an inert gas), such as argon (Ar), nitrogen ($N_2$), the like, or a combination thereof.

FIG. 4 is a flowchart of a method 400 of manufacturing IC dies according to some examples. At block 402, an etch process is performed on a first substrate in an interior volume of a chamber of a semiconductor processing tool. For example, the etch process may be performed on the IC die 200 in the semiconductor processing tool 100, as described above. As described above, aluminum-based byproducts (e.g., aluminum fluoride) of the etch process may be deposited on surfaces of the chamber in the interior volume 106. At block 404, the first substrate is removed from the interior volume of the chamber. A transfer chamber or load lock exterior to the chamber may be used to transfer substrates into and out of the interior volume 106 of the chamber. Hence, the interior volume 106 may be maintained at a low or reduced pressure, without exposing the interior volume 106 to an atmospheric, ambient environment, while a substrate is transferred into and out of the interior volume 106. Accordingly, at block 404, the first substrate may be removed using, e.g., a transfer chamber or load lock such that the interior volume 106 (and the first substrate) is not exposed to an atmospheric, ambient environment during the transfer.

At block 406, a cleaning process is performed in the interior volume of the chamber. No substrate is in the interior volume of the chamber while the cleaning process is performed. Aluminum-based byproducts from the etch process of block 402 may be removed from the interior volume 106 by the cleaning process of block 406. The cleaning process of block 406 may be referred to as an in situ chamber clean, a waferless auto-clean, and/or a chamber dry clean. The cleaning process of block 406 is described in more detail with respect to FIG. 5 subsequently. The etch process of block 402 may be performed any number of times on a corresponding number of substrates (and with those substrates being removed at block 404 before a subsequent etch process) before performing the cleaning process of block 406. During the etch process of block 404 through the cleaning process of block 406, the interior volume of the chamber may remain at a low or reduced pressure (e.g., maintained at vacuum), and the interior volume is not exposed to an atmospheric, ambient environment.

At block 408, optionally, the interior volume of the chamber is exposed to an atmospheric, ambient environment. For example, the interior volume of the chamber may be exposed to an atmospheric, ambient environment when the upper chamber housing 102 is removed from engaging the lower chamber housing 104 to perform maintenance to, e.g., the ESC 110 or other component in the chamber. With aluminum-based byproducts having been removed by the cleaning process of block 406, reaction of aluminum-based byproducts with a species in the environment may be reduced and/or avoided, and flaking of aluminum-based byproducts in the chamber may be reduced and/or avoided.

At block 410, a second substrate is loaded in the interior volume of the chamber. At block 410, the second substrate may be loaded in the interior volume using, e.g., a transfer chamber or load lock exterior to and engaging the chamber (e.g., the upper and lower chamber housings 102, 104) such that the interior volume 106 (and the second substrate) is not exposed to an atmospheric, ambient environment during the transfer. At block 412, an etch process is performed on the second substrate in the interior volume of the chamber. For example, the etch process may be performed on the IC die 200 in the semiconductor processing tool 100, as described above. The etch process of block 412 may be a same etch process as the etch process of block 402. During the loading at block 410 through the etch process of block 412, the interior volume of the chamber may remain at a low or reduced pressure (e.g., maintained at vacuum), and the interior volume is not exposed to an atmospheric, ambient environment.

FIG. 5 is a flowchart of a method of cleaning a semiconductor processing tool according to some examples. The method is implemented as the cleaning process of block 406 in some examples. At block 502, a cleaning process comprising flowing a reactive gas consisting of boron trichloride (BCl$_3$) into the interior volume of the chamber is performed. In some examples, the only reactive gas that is flowed at block 502 is boron trichloride (BCl$_3$) gas, and hence, one reactive gas consisting of boron trichloride (BCl$_3$) gas is flowed at block 502. No other reactive gas is flowed with the boron trichloride (BCl$_3$) gas at block 502, and more specifically, chlorine gas (Cl$_2$) is not flowed with the boron trichloride (BCl$_3$) gas at block 502. In some examples, a non-reactive gas (e.g., an inert gas) is flowed with the reactive gas as a carrier gas into the interior volume at block 502. The non-reactive gas may be or include argon (Ar), nitrogen (N$_2$), the like, or a combination thereof. A plasma is generated in the processing volume 152 in the chamber during the cleaning process of block 502, and hence, the reactive gas and any non-reactive gas flowed in the cleaning process of block 502 is energized and form in a plasma state, at least in part, the plasma.

In some examples, the process time for the cleaning process may be in a range from 5 seconds to 600 seconds. In some examples, the source power for the cleaning process, such as supplied by the power supply 126, may be in a range up to 3 KW (e.g., greater than zero Watts) at a frequency in a range from 10 MHz to 60 MHz (e.g., 13.56 MHz or 60 MHz). In some examples, no bias power, such from the power supply 130, is supplied for the cleaning process. In some examples, the pressure in the interior volume of the chamber for the cleaning process is in a range from 0 torr (0 Pa) to 900 mtorr (120 Pa). In some examples, for the cleaning process, boron trichloride (BCl$_3$) gas and argon (Ar) gas are flowed with a flow ratio (BCl$_3$:Ar) in a range from 30:1 to 1:1. In some examples, boron trichloride (BCl$_3$) gas is flowed at a flow rate in a range from 10 sccm to 300 sccm, and argon (Ar) gas is flowed at a flow rate in a range from 0 sccm to 1,000 sccm. In some examples, the gap 154 for the cleaning process may be set at a distance in a range from 1.1 inches (2.8 cm) to 3.8 inches (9.6 cm).

At block 504, a purge of the interior volume of the chamber comprising flowing a non-reactive gas (e.g., inert gas) into the interior volume of the chamber is performed. The non-reactive gas may be or include argon (Ar), nitrogen (N$_2$), the like, or a combination thereof. In some examples, the process time for the purge may be in a range from 10 seconds to 600 seconds. In some examples, the source power for the purge, such as supplied by the power supply 126, may be in a range up to 3 KW (e.g., greater than zero Watts) at a frequency in a range from 10 MHz to 60 MHz (e.g., 13.56 MHz or 60 MHz). In some examples, no bias power, such from the power supply 130, is supplied for the purge. In some examples, the pressure in the interior volume of the chamber for the purge is in a range from 0 torr to 900 mtorr. In some examples, for the purge, argon (Ar) gas and nitrogen (N$_2$) gas are flowed with a flow ratio (Ar:N$_2$) in a range from 10:1 to 1:1. In some examples, argon (Ar) gas is flowed at a flow rate in a range from 100 sccm to 1,000 sccm, and nitrogen (N$_2$) gas is flowed at a flow rate in a range from 0 sccm to 1,000 sccm. In some examples, the gap 154 for the purge may be set at a distance that is the same as the distance to which the gap 154 is set during the cleaning process of block 502, and in some examples, the gap 154 for the purge may be set at a distance in a range from 1.1 inches (2.8 cm) to 3.8 inches (9.6 cm).

At block 506, a cleaning process comprising flowing an oxygen-containing gas into the interior volume of the chamber is performed. The oxygen-containing gas may be or include oxygen (O$_2$), a gas mixture comprising oxygen (02), or the like. In some examples, block 506 includes multiple cleaning sub-processes. For example, block 506 may include a first cleaning sub-process that includes flowing a gas mixture of oxygen (O$_2$) and carbon tetrafluoride (CF$_4$) and a second cleaning sub-process that includes flowing only oxygen (O$_2$) gas. A plasma is generated in the processing volume 152 in the chamber during the cleaning process of block 506, and hence, the oxygen-containing gas and any non-reactive gas flowed in the cleaning process of block 506 (including any sub-processes) is energized and form in a plasma state, at least in part, the plasma.

In some examples, the process time for the first cleaning sub-process may be in a range from 10 seconds to 600 seconds. In some examples, the source power for the first cleaning sub-process, such as supplied by the power supply 126, may be in a range up to 3 KW (e.g., greater than zero Watts) at a frequency in a range from 10 MHz to 60 MHz (e.g., 13.56 MHz or 60 MHz). In some examples, no bias power, such from the power supply 130, is supplied for the first cleaning sub-process. In some examples, the pressure in the interior volume of the chamber for the first cleaning sub-process is in a range from 0 torr to 3 torr (400 Pa). In some examples, for the first cleaning sub-process, oxygen (O$_2$) gas and carbon tetrafluoride (CF$_4$) gas are flowed with a flow ratio (O$_2$:CF$_4$) in a range from 2,000:1 to 1:1. In some examples, oxygen (O$_2$) gas is flowed at a flow rate in a range from 0 sccm to 2,000 sccm, and carbon tetrafluoride (CF$_4$) gas is flowed at a flow rate in a range from 0 sccm to 700 sccm. In some examples, the gap 154 for the first cleaning sub-process is decreased relative to the preceding purge at block 504, which may result in increased plasma interaction with the gas showerhead 142, and may be set at a distance in a range from 1.1 inches (2.8 cm) to 3.8 inches (9.6 cm).

In some examples, the process time for the second cleaning sub-process may be in a range from 10 seconds to 600 seconds. In some examples, the source power for the second cleaning sub-process, such as supplied by the power supply 126, may be in a range up to 3 KW (e.g., greater than zero Watts) at a frequency in a range from 10 MHz to 60 MHz (e.g., 13.56 MHz or 60 MHz). In some examples, the bias power for the second cleaning sub-process, such as supplied by the power supply 130, may be in a range up to 5 KW (e.g., greater than zero Watts) at a frequency in a range from 10 MHz to 60 MHz (e.g., 13.56 MHz or 60 MHz). In some examples, the pressure in the interior volume of the chamber for the second cleaning sub-process is in a range from 0 torr to 900 mtorr. In some examples, oxygen ($O_2$) gas is flowed at a flow rate in a range from 10 sccm to 2,000 sccm. In some examples, the gap 154 for the second cleaning sub-process is increased relative to the first cleaning sub-process and may be set at a distance in a range from 1.1 inches (2.8 cm) to 3.8 inches (9.6 cm).

At block 508, a purge of the interior volume of the chamber comprising flowing a gas into the interior volume of the chamber is performed. In some examples, the process time for the purge may be in a range from 10 seconds to 600 seconds. In some examples, no source power, such from the power supply 126, is supplied for the purge. In some examples, no bias power, such from the power supply 130, is supplied for the purge. In some examples, the pressure in the interior volume of the chamber for the purge is in a range from 0 torr to 900 mtorr. In some examples, for the purge, oxygen ($O_2$) gas and argon (Ar) gas are flowed with a flow ratio ($O_2$:Ar) in a range from 2,000:1 to 1:1,000. In some examples, oxygen ($O_2$) gas is flowed at a flow rate in a range from 0 sccm to 2,000 sccm, and argon (Ar) gas is flowed at a flow rate in a range from 0 sccm to 1,000 sccm. In some examples, the gap 154 for the purge may be set at a distance in a range from 1.1 inches (2.8 cm) to 3.8 inches (9.6 cm).

The controller 180, as detailed subsequently, includes one or more processors and non-transitory memory having instructions stored thereon. The instructions, when executed by the one or more processors, cause the controller 180 to control: the pedestal to raise or lower the substrate support 108 for a change in the gap 154 as appropriate; the power supplies 126, 130 to turn on or off and supply an amount of power to respective electrodes 124, 128 as appropriate; and the mass flow controllers 160-168 to selectively open or close to flow a respective gas to the manifold and into the chamber.

Table 1 shows an example implementation of the cleaning process of FIG. 5.

processes, where at least one cleaning process is directed at removing aluminum-based byproducts and another at least one cleaning process is directed at removing other organic and/or oxide-based byproducts (e.g., polymers). For example, the cleaning process of block 502 is directed at removing aluminum-based byproducts by using boron trichloride ($BCl_3$) gas. It has been observed that chlorine free radicals (e.g., Cl•) dissociate from boron in the boron trichloride ($BCl_3$), and the chlorine free radicals volatize the aluminum-based byproducts that had accumulated on surfaces of the interior volume of the chamber. The purge at block 504 may then remove the volatized aluminum-based byproducts from the interior volume of the chamber. The cleaning process of block 506 (including the first and second cleaning sub-processes) is directed at removing other organic and/or oxide-based byproducts. The volatized byproducts may then be removed from the interior volume of the chamber by the purge of block 508.

In some examples, using boron trichloride ($BCl_3$) as the only reactive gas in the cleaning process of block 502 (e.g., without another reactive gas, particularly chlorine gas ($Cl_2$)) led to unexpected results. It was not expected that chlorine would ionize from the boron trichloride ($BCl_3$) and that chlorine free radicals would be present in the plasma used in the cleaning process of block 502 in sufficient amount and/or density to volatize the aluminum-based byproducts without being supplemented with chlorine gas ($Cl_2$). However, it was observed that flowing boron trichloride ($BCl_3$) as the only reactive gas in the cleaning process of block 502 resulted in the aluminum-based byproducts being volatized and subsequently removed from the interior volume of the chamber. Hence, according to some examples, instances of particles of the aluminum-based byproducts contaminating IC dies and/or landing on an ESC may be reduced due to the cleaning of the interior volume of the chamber and removal of those byproducts from the interior volume of the chamber.

TABLE 1

| Block | Time (sec) | Gap (in) | Source Power (W) | Bias Power (W) | Pressure (mtorr) | Gas | Flow Rate (sccm) |
|---|---|---|---|---|---|---|---|
| 502 | 10 | 3.5 | 1,000 | 0 | 100 | $BCl_3$ | 150 |
| | | | | | | Ar | 150 |
| 504 | 10 | 3.5 | 1,000 | 0 | 100 | $N_2$ | 200 |
| | | | | | | Ar | 800 |
| 506 First sub-process | 10 | 1.25 | 750 | 0 | 250 | $O_2$ | 1,500 |
| | | | | | | $CF_4$ | 50 |
| 506 Second sub-process | 10 | 3.5 | 750 | 100 | 250 | $O_2$ | 1,500 |
| 508 | 10 | 3.5 | 0 | 0 | 100 | $O_2$ | 1,500 |
| | | | | | | Ar | 500 |

In an etch process (e.g., of block 402) in which aluminum is etched (such as slightly as described with respect to FIG. 3), aluminum can react with residual fluorine from the etch process and the reacted aluminum-based byproducts (e.g., aluminum fluoride) can become deposited or adhered on surfaces in the interior volume of the chamber. The aluminum-based byproducts may be nonvolatile in an oxygen ($O_2$)-based dry cleaning chemistry that may be used for removing other organic and/or oxide-based byproducts. If a sufficient amount of the aluminum-based byproducts accumulates on a surface, particles of the aluminum-based byproducts may flake off causing adverse effects as described previously.

Figure 6:
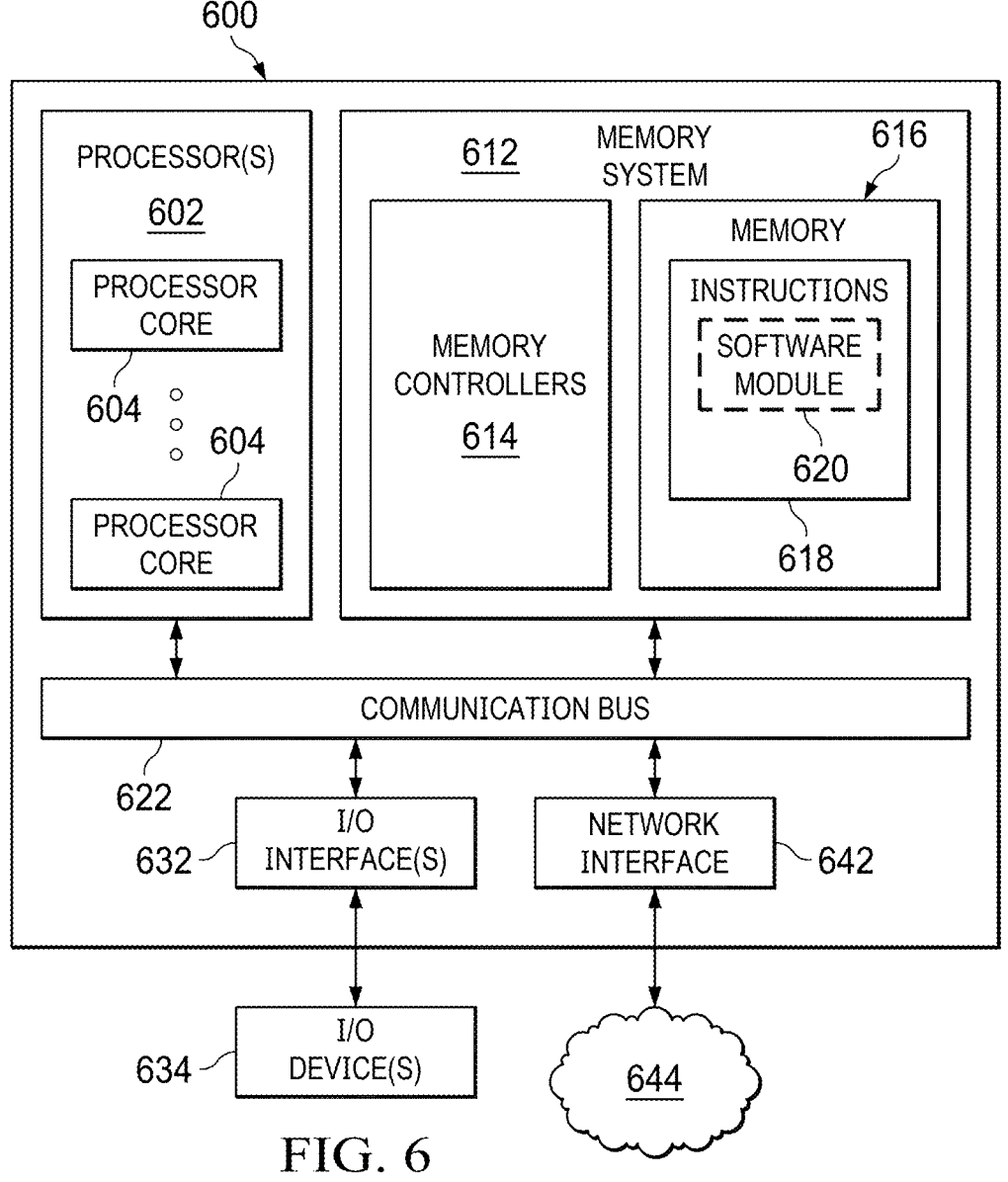
FIG. 6 is a block diagram of a processor-based system according to some examples.

In some examples, such as provided with respect to Table 1 above, a cleaning process includes multiple cleaning FIG. 6 is a block diagram of a processor-based system 600 according to some examples. The processor-based system 600 may be or include a computer, a server, a programmable logic controller (PLC), the like, or a combination thereof. The processor-based system 600 may be implemented as the controller 180 or as any other processor-based system to implement any operations described herein. The processor-based system 600 includes one or more processors 602, a memory system 612, a communication bus 622, one or more input/output (I/O) interfaces 632, and a network interface 642.

Each processor 602 may include one or more processor cores 604. Each processor 602 and/or processor core 604 may be, for example, a hardened processor, such as a central processing unit (CPU), a reduced instruction set computing (RISC) processor, a complex instruction set computing (CISC) processor, a graphics processing unit (GPU), a digital signal processor (DSP), an application specific integrated circuit (ASIC), the like, or a combination thereof, or a soft processor implemented on programmable logic, such as a field programmable gate array (FPGA).

The memory system 612 includes one or more memory controllers 614 and memory 616. The memory controllers 614 are configured to control read and/or write access to a particular memory 616 or subset of memory 616. The memory 616 may include main memory, disk storage, or any suitable combination thereof. The memory 616 may include any type of volatile or nonvolatile memory, such as dynamic random access memory (DRAM), static random access memory (SRAM), erasable programmable read-only memory (EPROM), electrically erasable programmable read-only memory (EEPROM), Flash memory, solid-state storage, etc. The memory 616 is a non-transitory machine-readable storage medium. Instructions 618 are stored in the memory 616. The instructions 618 may be machine-executable code (e.g., machine code) and may comprise firmware, software, a program, an application, or other machine-executable code. The instructions 618 may, for example, embody a software module 620, which when executed by the one or more processors 602, performs various functionality and operations described herein. For example, the instructions 618 may embody a software module 620, which when executed by the one or more processors 602, controls the semiconductor processing tool 100 to perform the cleaning process of block 406 (e.g., including blocks 502-508) and, possibly, the etch processes of blocks 402, 412, among other things.

The one or more I/O interfaces 632 are configured to be electrically and/or communicatively coupled to one or more I/O devices 634. The I/O devices 634 include the pedestal 116, the power supplies 126, 130, and the mass flow controllers 160-168. Other example I/O devices 634 include a keyboard, a mouse, a display device, a printer, etc. The one or more I/O interfaces 632 may include connectors or coupling circuitry, such as an industrial application connection, a universal serial bus (USB) connection, a high-definition multimedia interface (HDMI) connection, Bluetooth® circuitry, or the like.

The network interface 642 is configured to be communicatively coupled to a network 644. The network interface 642 may include circuitry for wired communication, such as an Ethernet connection, and/or may include circuitry for wireless communication, such as a circuitry for Wi-Fi® communications. For example, one or more computers and/or servers communicatively coupled to the network 644 may communicate a recipe, process conditions, or the like to the processor-based system 600 via the network 644 and the network interface 642.

The communication bus 622 is communicatively connected to the one or more processors 602, the memory system 612, the one or more I/O interfaces 632, and the network interface 642. The various components can communicate between each other via the communication bus 622. The communication bus 622 may control the flow of communications, such as by including an arbiter to arbitrate the communications.

Although various examples have been described in detail, it should be understood that various changes, substitutions, and alterations may be made therein without departing from the scope defined by the appended claims.

What is claimed is:

1. A method of manufacturing an integrated circuit (IC), the method comprising:

performing a first cleaning process on an interior surface of a chamber of a semiconductor processing tool, the first cleaning process comprising flowing a gas mixture consisting of a non-reactive gas and boron trichloride ($BCl_3$) gas into an interior volume of the chamber, the interior volume being defined at least in part by the interior surface;

after performing the first cleaning process, performing a first purge of the interior volume of the chamber;

after performing the first purge, performing a second cleaning process on the interior surface of the chamber, the second cleaning process comprising flowing an oxygen-containing gas into the interior volume of the chamber; and after performing the second cleaning process, performing a second purge of the interior volume of the chamber; and after performing the first cleaning process, etching a material layer over a semiconductor substrate in the chamber.

2. The method of claim 1, wherein the non-reactive gas comprises argon (Ar), nitrogen ($N_2$), or a combination thereof.

3. The method of claim 1, wherein performing the first cleaning process comprises generating a plasma in the interior volume of the chamber while flowing the gas mixture into the interior volume of the chamber.

4. The method of claim 1, wherein performing the first cleaning process comprises energizing the gas mixture comprising supplying power in a range from greater than 0 W to 3 kW.

5. The method of claim 4, wherein the first cleaning process is performed in the absence of a bias power applied to a substrate support disposed in the interior volume of the chamber.

6. A method comprising:

flowing a gas mixture consisting of a non-reactive gas and boron trichloride ($BCl_3$) into an interior volume of a chamber of a semiconductor processing tool;

after flowing the gas mixture, performing a first purge of the interior volume of the chamber;

after performing the first purge, flowing an oxygen-containing gas mixture into the interior volume of the chamber; and after flowing the oxygen-containing gas mixture, performing a second purge of the interior volume of the chamber.

7. The method of claim 6, wherein radio frequency power is supplied to an electrode in the interior volume of the chamber while flowing the gas mixture into the interior volume of the chamber, the radio frequency power being in a range from greater than 0 W to 3 kW.

8. The method of claim 6, wherein the oxygen-containing gas mixture comprises oxygen ($O_2$).

9. The method of claim 6, wherein the oxygen-containing gas mixture comprises carbon tetrafluoride ($CF_4$).

10. The method of claim 6, wherein the oxygen-containing gas mixture consists of oxygen ($O_2$) and carbon tetrafluoride ($CF_4$).

11. A processing tool for semiconductor processing, the processing tool comprising:

a chamber having an interior volume;

a substrate support disposed in the interior volume, the substrate support comprising a support surface configured to support a semiconductor substrate; and a controller comprising one or more processors and non-transitory memory comprising stored instructions, which when executed by the one or more processors, cause the controller to:

flow a gas mixture consisting of a non-reactive gas and boron trichloride ($BCl_3$) into the interior volume of the chamber;

after flowing the gas mixture, perform a first purge of the interior volume of the chamber;

after performing the first purge, flow an oxygen-containing gas into the interior volume of the chamber; and after flowing the oxygen-containing gas, perform a second purge of the interior volume of the chamber.

12. The processing tool of claim 11 further comprises:

a power supply; and an electrode disposed in the interior volume, wherein the stored instructions, which when executed by the one or more processors, cause the controller to control the power supply to supply power to the electrode to generate a plasma in the interior volume of the chamber while flowing the gas mixture into the interior volume of the chamber.

13. The processing tool of claim 12, wherein the power is in a range from greater than 0 W to 3 kW.

14. The processing tool of claim 11, wherein the oxygen-containing gas comprises oxygen ($O_2$).

15. The processing tool of claim 11, wherein the oxygen-containing gas comprises carbon tetrafluoride ($CF_4$).

16. The processing tool of claim 11, wherein the oxygen-containing gas consists of oxygen ($O_2$) and carbon tetrafluoride ($CF_4$).

17. A method of cleaning a semiconductor etching tool, the method comprising:

performing a first cleaning process on an interior surface of a chamber of the semiconductor etching tool, the first cleaning process comprising flowing a gas mixture consisting of a non-reactive gas and boron trichloride ($BCl_3$) into an interior volume of the chamber, the interior volume being defined at least in part by the interior surface;

after performing the first cleaning process, performing a first purge of the interior volume of the chamber;

after performing the first purge, performing a second cleaning process on the interior surface of the chamber, the second cleaning process comprising flowing an oxygen-containing gas into the interior volume of the chamber; and after performing the second cleaning process, performing a second purge of the interior volume of the chamber.

18. A method of manufacturing an integrated circuit (IC), the method comprising:

performing a first cleaning process on an interior surface of a process chamber of a semiconductor processing tool, the first cleaning process comprising flowing a gas mixture consisting of a non-reactive gas and boron trichloride ($BCl_3$) gas into an interior volume of the process chamber, the interior volume being defined at least in part by the interior surface, and directing radio frequency power in a range from greater than 0 W to 3 kW to the process chamber, wherein the first cleaning process is performed in the absence of a bias power applied to a substrate support disposed in the interior volume of the process chamber; and after performing the first cleaning process, etching a material layer over a semiconductor substrate in the process chamber.

* * * * *